US012199142B2

(12) United States Patent
Chouksey et al.

(10) Patent No.: US 12,199,142 B2
(45) Date of Patent: Jan. 14, 2025

(54) NEIGHBORING GATE-ALL-AROUND INTEGRATED CIRCUIT STRUCTURES HAVING CONDUCTIVE CONTACT STRESSOR BETWEEN EPITAXIAL SOURCE OR DRAIN REGIONS

(71) Applicant: Intel Corporation, Santa Clara, CA (US)

(72) Inventors: Siddharth Chouksey, Portland, OR (US); Jack T. Kavalieros, Portland, OR (US); Stephen M. Cea, Hillsboro, OR (US); Ashish Agrawal, Beaverton, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 856 days.

(21) Appl. No.: 17/133,092

(22) Filed: Dec. 23, 2020

(65) Prior Publication Data

US 2022/0199771 A1    Jun. 23, 2022

(51) Int. Cl.
*H01L 29/66* (2006.01)
*H01L 27/088* (2006.01)
(Continued)

(52) U.S. Cl.
CPC ...... *H01L 29/0669* (2013.01); *H01L 27/0886* (2013.01); *H01L 29/41791* (2013.01);
(Continued)

(58) Field of Classification Search
None
See application file for complete search history.

(56) References Cited

U.S. PATENT DOCUMENTS 9,590,038 B1    3/2017    Kim et al.
2011/0133165 A1    6/2011    Bangsaruntip et al.
(Continued)

FOREIGN PATENT DOCUMENTS

EP    3644375    4/2020

OTHER PUBLICATIONS

Extended European Search Report for European Patent Application No. 21198785.4 mailed Mar. 18, 2022, 8 pgs.

*Primary Examiner* — Joseph C. Nicely
*Assistant Examiner* — Lamont B Koo
(74) *Attorney, Agent, or Firm* — Schwabe, Williamson & Wyatt P.C.

(57) ABSTRACT

Neighboring gate-all-around integrated circuit structures having a conductive contact stressor between epitaxial source or drain regions are described. In an example, a first vertical arrangement of nanowires and a second vertical arrangement of nanowires above a substrate. A first gate stack is over the first vertical arrangement of nanowires. A second gate stack is over the second vertical arrangement of nanowires. First epitaxial source or drain structures are at ends of the first vertical arrangement of nanowires. Second epitaxial source or drain structures are at ends of the second vertical arrangement of nanowires. An intervening conductive contact structure is between neighboring ones of the first epitaxial source or drain structures and of the second epitaxial source or drain structures. The intervening conductive contact structure imparts a stress to the neighboring ones of the first epitaxial source or drain structures and of the second epitaxial source or drain structures.

20 Claims, 12 Drawing Sheets

(51) Int. Cl.
 *H01L 29/06* (2006.01)
 *H01L 29/417* (2006.01)
 *H01L 29/78* (2006.01)

(52) U.S. Cl.
 CPC .... *H01L 29/66795* (2013.01); *H01L 29/7813* (2013.01); *H01L 29/785* (2013.01); *H01L 2029/7858* (2013.01)

(56) References Cited

U.S. PATENT DOCUMENTS

2019/0326290 A1\* 10/2019 Cea ........................ H01L 29/417
2020/0266271 A1 8/2020 Lin et al.
2021/0384311 A1\* 12/2021 Wu ................... H01L 29/66439

\* cited by examiner

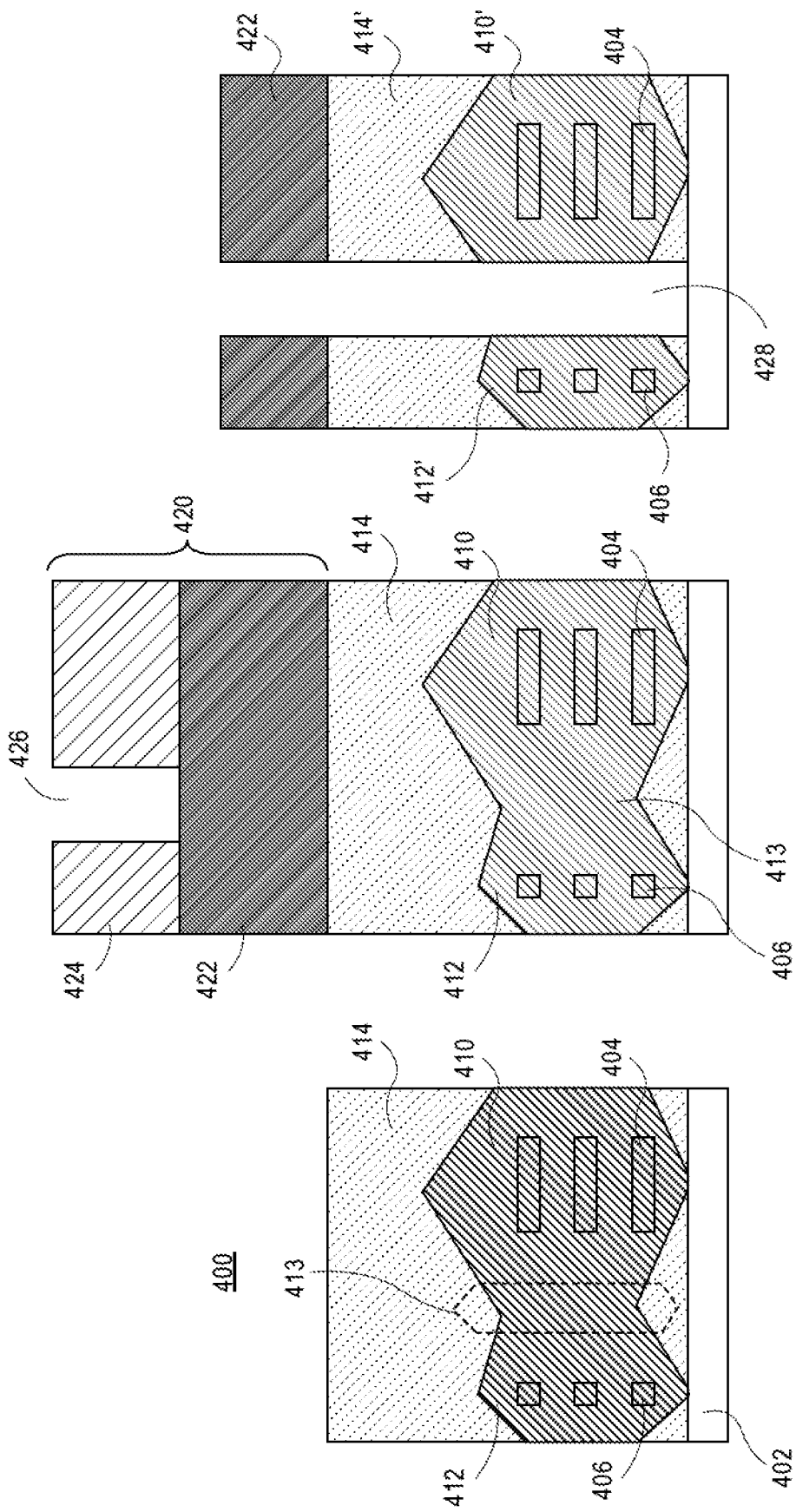

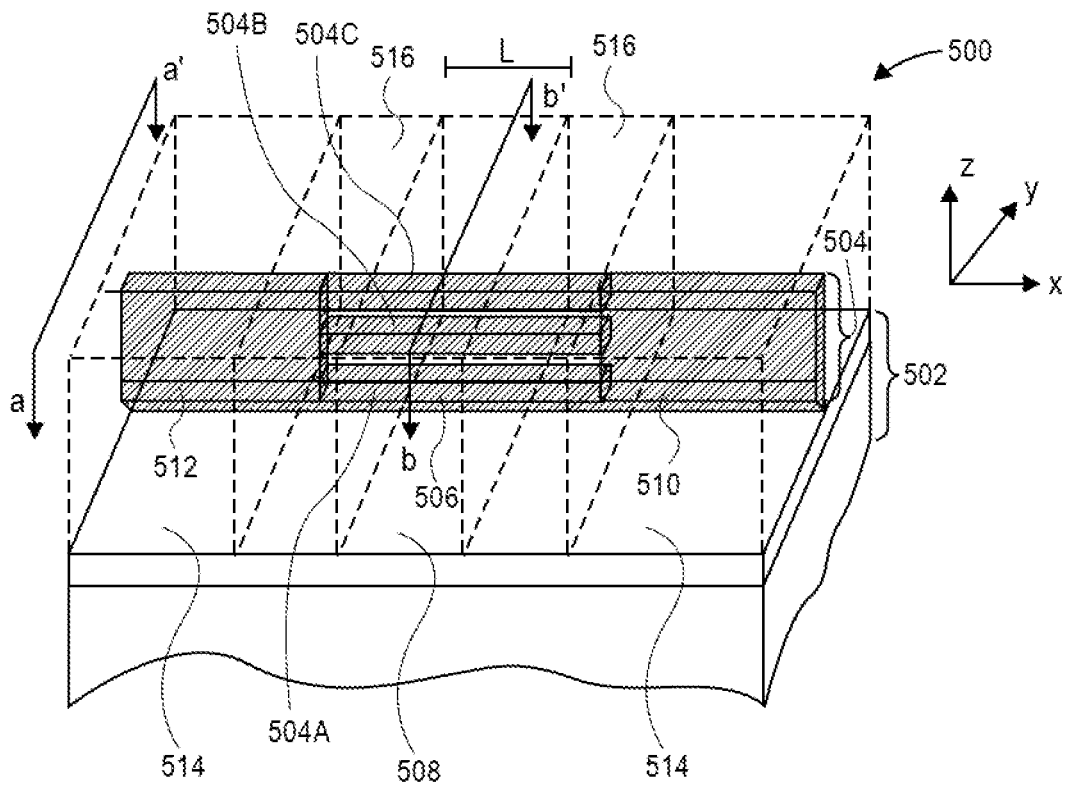
FIG. 5A
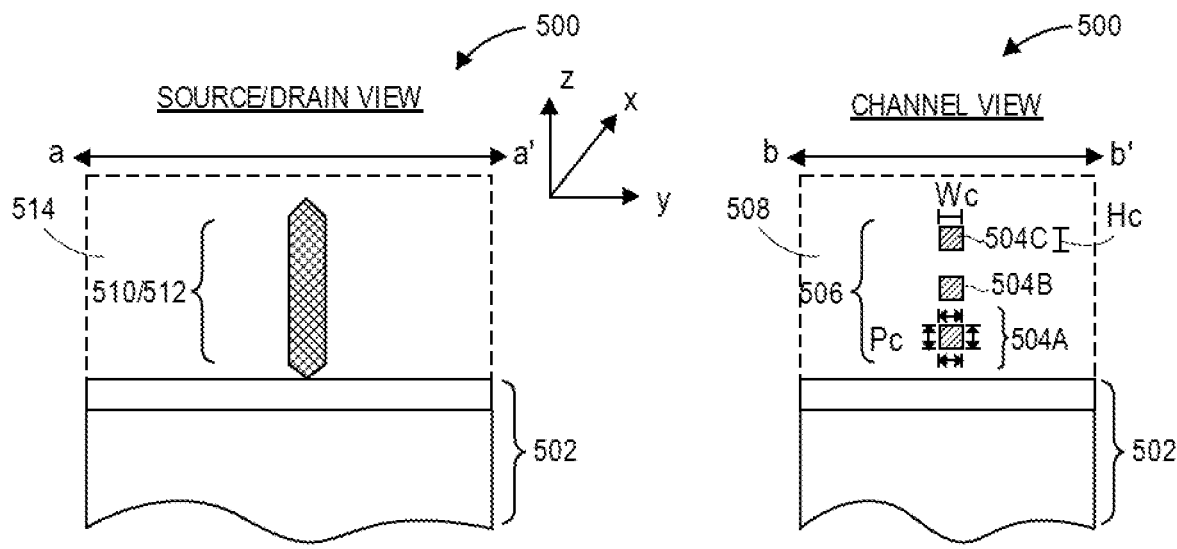
FIG. 5B  FIG. 5C

NEIGHBORING GATE-ALL-AROUND INTEGRATED CIRCUIT STRUCTURES HAVING CONDUCTIVE CONTACT STRESSOR BETWEEN EPITAXIAL SOURCE OR DRAIN REGIONS

TECHNICAL FIELD

Embodiments of the disclosure are in the field of integrated circuit structures and processing and, in particular, neighboring gate-all-around integrated circuit structures having a conductive contact stressor between epitaxial source or drain regions, and methods of fabricating neighboring gate-all-around integrated circuit structures having a conductive contact stressor between epitaxial source or drain regions.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIGS. 4A-4E illustrate cross-sectional views representing various operations in another method of fabricating neighboring gate-all-around integrated circuit structures having a conductive contact stressor between epitaxial source or drain regions, in accordance with an embodiment of the present disclosure.

FIG. 5A illustrates a three-dimensional cross-sectional view of a nanowire-based integrated circuit structure, in accordance with an embodiment of the present disclosure.

FIG. 5B illustrates a cross-sectional source or drain view of the nanowire-based integrated circuit structure of FIG. 5A, as taken along the a-a' axis, in accordance with an embodiment of the present disclosure.

FIG. 5C illustrates a cross-sectional channel view of the nanowire-based integrated circuit structure of FIG. 5A, as taken along the b-b' axis, in accordance with an embodiment of the present disclosure.

DESCRIPTION OF THE EMBODIMENTS

Figure 1:
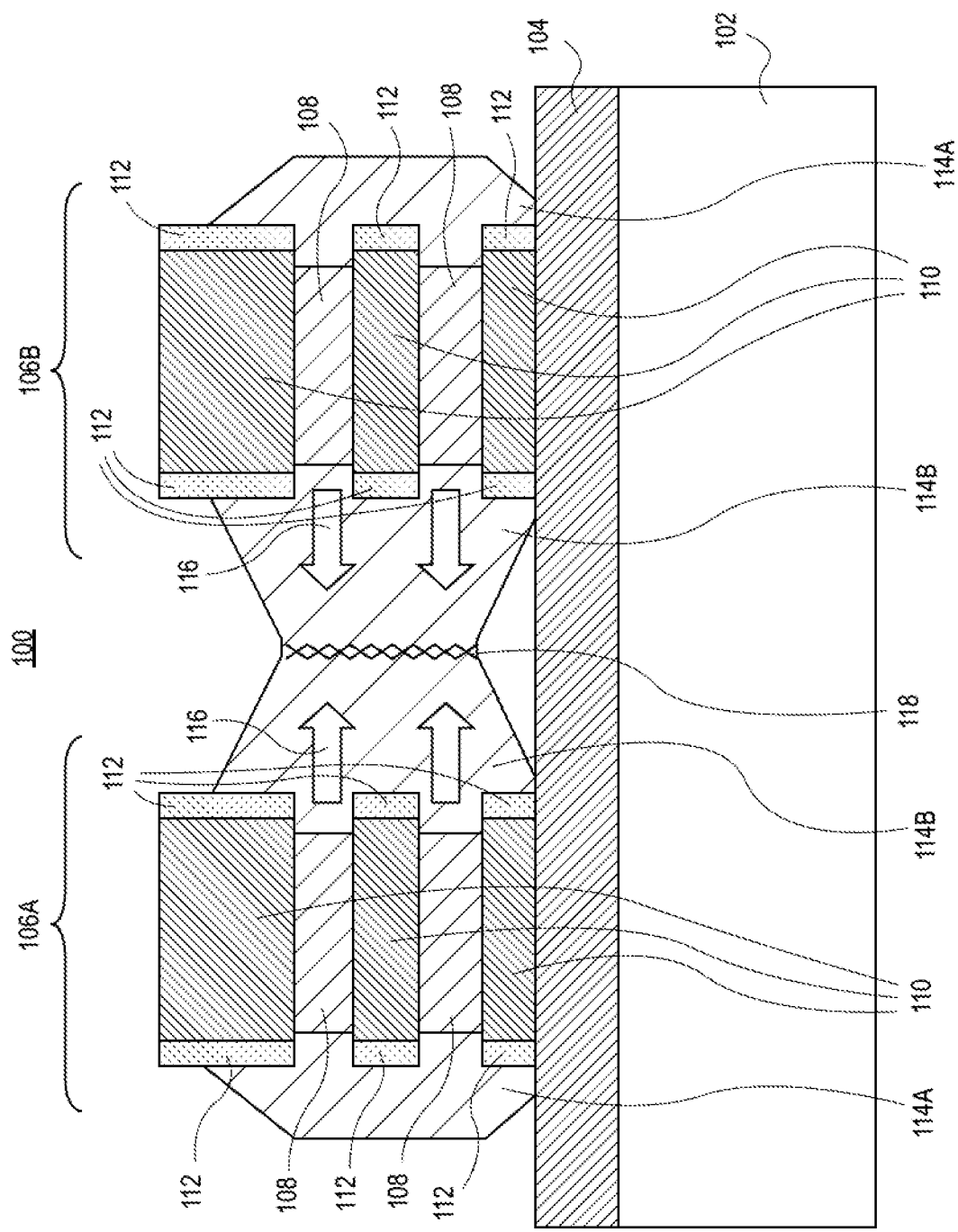
FIG. 1 illustrates a cross-sectional view of a gate-all-around integrated circuit structure having merged or joined neighboring epitaxial source or drain regions.

Neighboring gate-all-around integrated circuit structures having a conductive contact stressor between epitaxial source or drain regions, and methods of fabricating neighboring gate-all-around integrated circuit structures having a conductive contact stressor between epitaxial source or drain regions, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments are directed to conductive contact stressor structures for nanowire or nanoribbon based structures. One or more embodiments are directed to epitaxial region (EPI) splitting or separating or disjoining for same-width or multi-width (Wsi) nanowires/nanoribbons having as-formed merged EPI regions. One or more embodiments are directed to neighboring semiconductor structures or devices having that are otherwise not separated by an intervening dielectric structure.

To provide contact, for a nanoribbon CMOS with isolation oxide, epitaxial material (epi) grows from the channel and merges with Epi from the next (adjacent or neighboring) channel. This can cause significant defects at the interface, which can render the epi ineffective in terms of imparting strain to the channel.

In accordance with one or more embodiments described herein, epi is grown partially such that growth fronts do not meet, and there is space between the two epi structures to form a sacrificial material there between. The sacrificial material can then be etched post-contact opening and filled with metal stressors. The metal stressors can be different for NMOS and PMOS, such that NMOS is tensely strained, and PMOS is compressively strained for optimal CMOS performance. As non-limiting examples, the sacrificial material can be a metal-including film such as titanium nitride (TiN), or can be a carbon-doped nitride film with etch selectivity to silicon nitride and silicon oxide.

Particular embodiments may be directed to integration of multiple width (multi-Wsi) nanowires and nanoribbons in a non-self-aligned gate endcap (non-SAGE) architecture, or in neighboring regions of a SAGE architecture that are not immediately separated by a SAGE wall. In an embodiment, nanowires/nanoribbons are integrated with same or multiple Wsi in a non-SAGE architecture or non-SAGE portion of a front end process flow. Such a process flow may involve integration of nanowires and nanoribbons of same or different Wsi to provide robust functionality of next generation transistors with low power and high performance.

As an exemplary structure illustrating nanoribbon-based CMOS structures with epi merging from two adjacent channels, FIG. 1 illustrates a cross-sectional view of a gate-all-around integrated circuit structure having merged or joined neighboring epitaxial source or drain regions.

Referring to FIG. 1, an integrated circuit structure 100 includes an isolation oxide layer 104 (such as a silicon oxide layer) on a substrate 102, such as a silicon substrate. A first vertical arrangement 106A of nanowires or nanoribbons 108 and a second vertical arrangement 106B of nanowires or nanoribbons 108 are above the isolation oxide layer 104. A first gate structure 110 (which may be a dummy gate structure) is over the first vertical arrangement 106A of nanowires or nanoribbons 108, and a second gate structure 110 (which may be a dummy gate structure) is over the second vertical arrangement 106B of nanowires or nanoribbons 108. Dielectric gate spacers 112 can be associated with each of the gate structures 110. First epitaxial source or drain structures 114A/114B are formed at ends of the first vertical arrangement 106A of nanowires or nanoribbons 108. Second epitaxial source or drain structures 114B/114A are formed at ends of the second vertical arrangement 106B of nanowires or nanoribbons 108. The source or drain structures 114B of each of 106A and 106B have a merged region there between along a direction 116. The epi of 114B grows from the nanowires or nanoribbons 108 and can meet in the middle to form a defective interface 118. It is to be appreciated that the isolation oxide layer 104 blocks epi growth and, as such, the dominant growth pattern is along direction 116 in such a structure.

By contrast to FIG. 1, FIGS. 2A-2C and 3 illustrate cross-sectional views representing various operations in a method of fabricating neighboring gate-all-around integrated circuit structures having a conductive contact stressor between epitaxial source or drain regions, in accordance with an embodiment of the present disclosure.

Figure 2A:
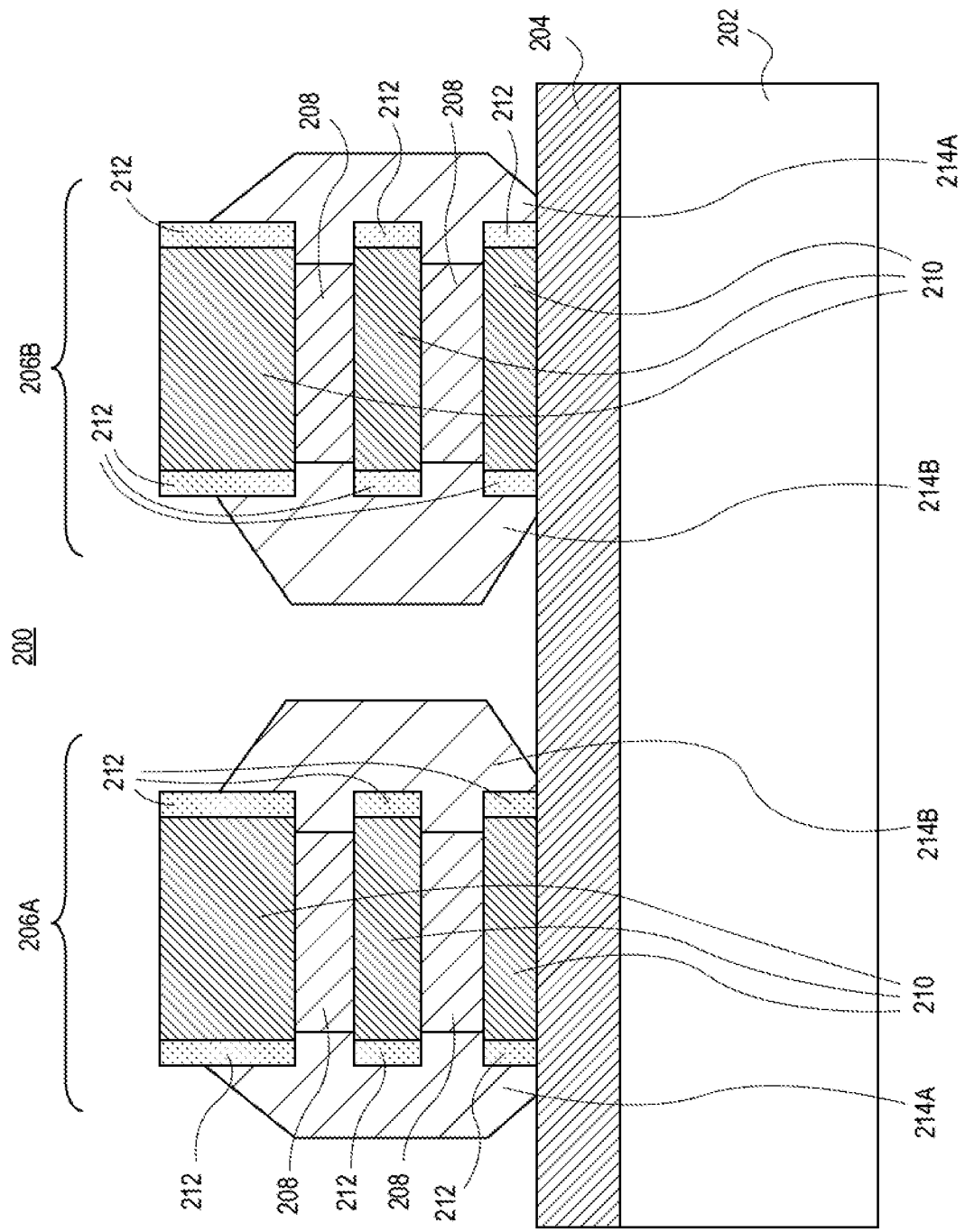
FIGS. 2A-2C illustrate cross-sectional views representing various operations in a method of fabricating neighboring gate-all-around integrated circuit structures having a conductive contact stressor between epitaxial source or drain regions, in accordance with an embodiment of the present disclosure.

Referring to FIG. 2A, a method of fabricating an integrated circuit structure 250 involves forming an initial structure 200 including an isolation oxide layer 204 (such as a silicon oxide layer) on a substrate 202, such as a silicon substrate. A first vertical arrangement 206A of nanowires or nanoribbons 208 and a second vertical arrangement 206B of nanowires or nanoribbons 208 are above the isolation oxide layer 204. A first gate structure 210 (which may be a dummy gate structure) is over the first vertical arrangement 206A of nanowires or nanoribbons 208, and a second gate structure 210 (which may be a dummy gate structure) is over the second vertical arrangement 206B of nanowires or nanoribbons 208. Dielectric gate spacers 212 can be associated with each of the gate structures 210. First epitaxial source or drain structures 214A/214B are formed at ends of the first vertical arrangement 206A of nanowires or nanoribbons 208. Second epitaxial source or drain structures 214B/214A are formed at ends of the second vertical arrangement 206B of nanowires or nanoribbons 208. The source or drain structures 214B of each of 206A and 206B are adjacent one another but are not merged. In one such embodiment, growth of the epi source or drain regions 214A/214B is controlled such that the source or drain structures 214B of each of 206A and 206B do not merge, and rather leave a space there between.

Figure 2B:
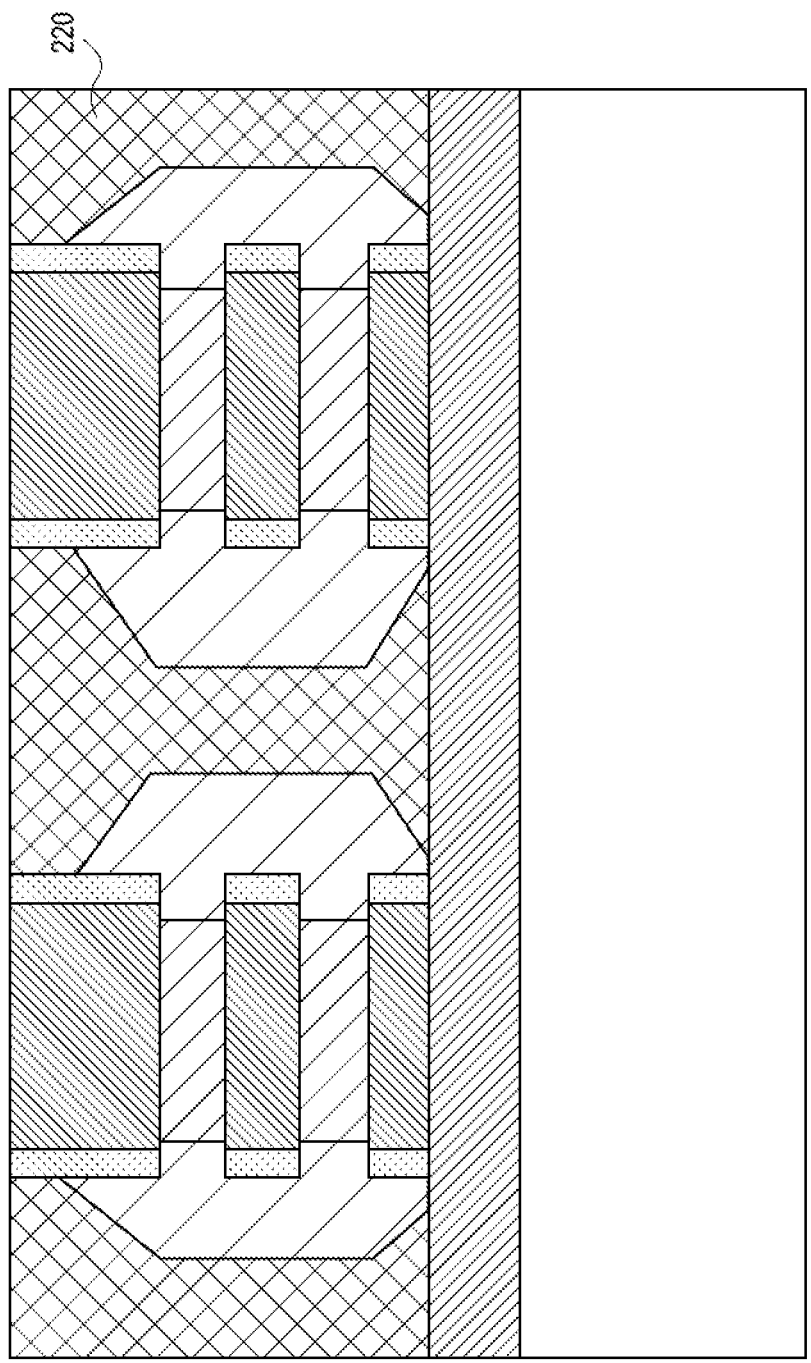

Referring to FIG. 2B, a sacrificial material 220 is formed over the structure of FIG. 2A. In one embodiment, the sacrificial material 220 is a dielectric material, such as a carbon-doped nitride material. In one embodiment, an excess volume of the sacrificial material is first deposited, and then is planarized to form the structure 220 of FIG. 2B.

Figure 2C:
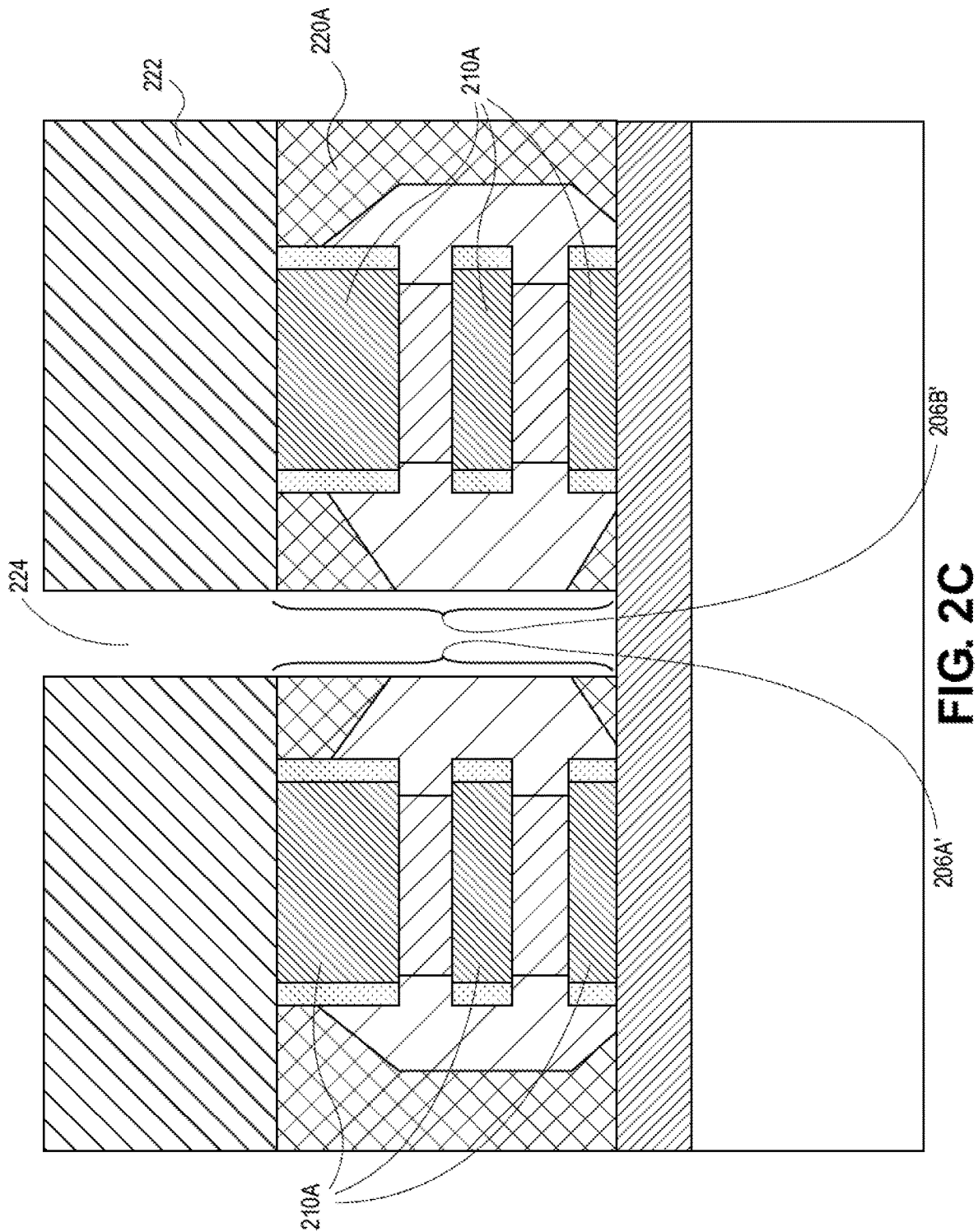

Referring to FIG. 2C, a hardmask 222 is formed over the structure of FIG. 2C. In one embodiment, the hardmask 222 is patterned using a trilayer mask composed of a topographic masking portion, an anti-reflective coating (ARC) layer, and a photoresist layer patterned to have an opening 224 therein. The pattern of the opening is then extended to form hardmask 222 and through sacrificial material 220 to form patterned sacrificial material 220A. It is to be appreciated that, in one embodiment, prior to formation of hardmask 222, in the case that gate structures 210 are dummy gate structures, the gate structures 210 are replaced with permanent gate structures 210A to form modified structures 206A' and 206B' in a replacement gate process, e.g., a permanent gate structure including a high-k gate dielectric layer and a metal gate electrode.

Figure 3:
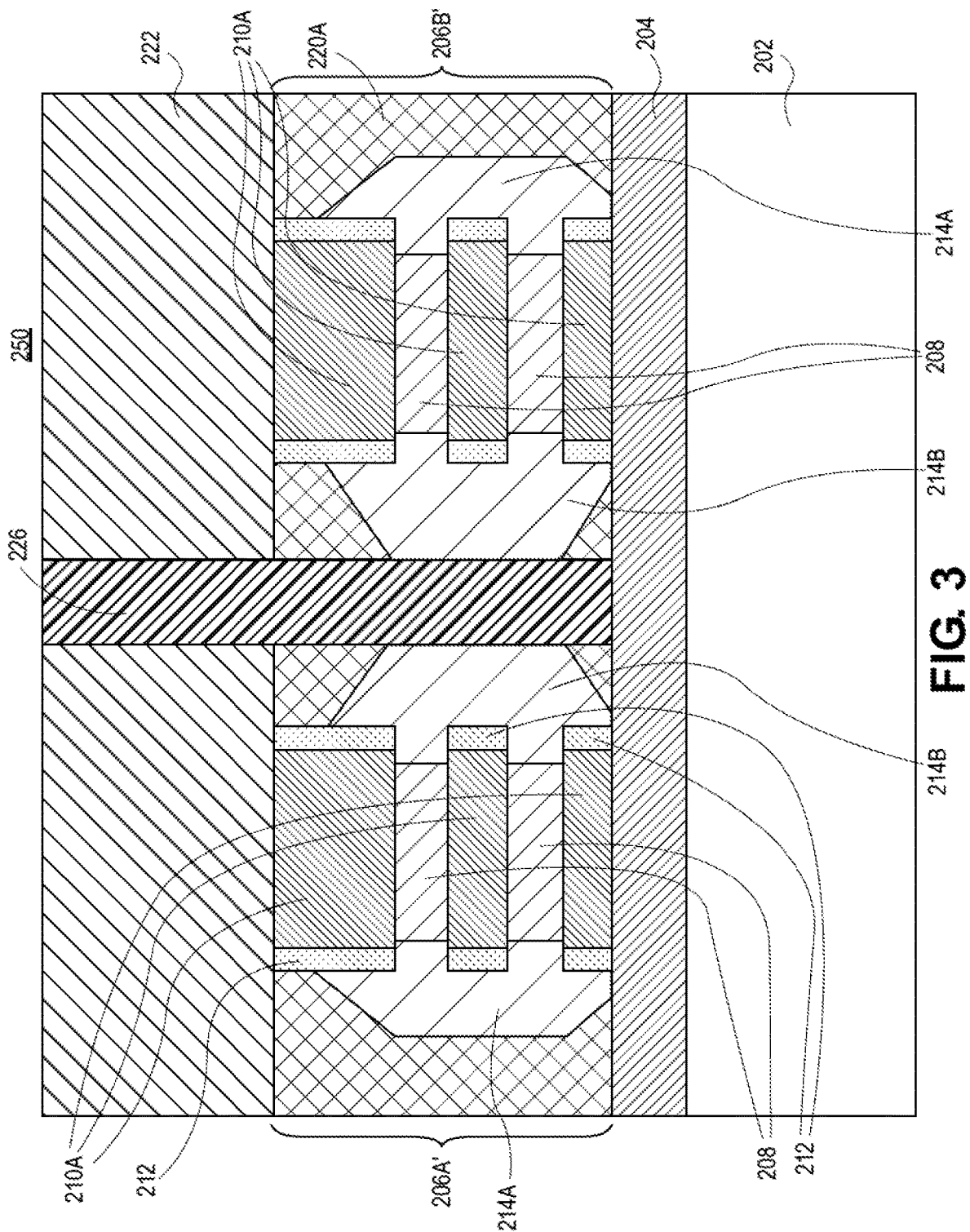
FIG. 3 illustrates a cross-sectional view representing an operation in a method of fabricating neighboring gate-all-around integrated circuit structures having a conductive contact stressor between epitaxial source or drain regions, in accordance with an embodiment of the present disclosure.

Referring to FIG. 3, the opening 224 is filled with a conductive material. In one embodiment, filling the opening 224 with the conductive material forms a conductive contact structure 226. In an embodiment, the conductive contact structure 226 is an intervening conductive contact structure 226 between neighboring ones of the first epitaxial source or drain structures 214B and of the second epitaxial source or drain structures 214B.

In an embodiment, the intervening conductive contact structure 226 imparts a stress to the neighboring ones of the first epitaxial source or drain structures 214B and of the second epitaxial source or drain structures 214B. In one such embodiment, the intervening conductive contact structure 226 imparts a tensile stress to the neighboring ones of the first epitaxial source or drain structures 214B and of the second epitaxial source or drain structures 214B. In a specific such embodiment, the intervening conductive contact structure 226 includes tungsten. In another embodiment, the intervening conductive contact structure 226 imparts a compressive stress to the neighboring ones of the first epitaxial source or drain structures 214B and of the second epitaxial source or drain structures 214B.

Referring again to FIG. 3, in an embodiment, the first gate stack (of 206A') has dielectric sidewall spacers 212, and the first epitaxial source or drain structures 214A/214B are first embedded epitaxial source or drain structures extending beneath the dielectric sidewalls spacers of the first gate stack, as is depicted. The second gate stack (of 206B') has dielectric sidewall spacers 212, and the second epitaxial source or drain structures 214B/214A are second embedded epitaxial source or drain structures extending beneath the dielectric sidewalls spacers of the second gate stack, as is also depicted.

To provide further context, advantages of a self-aligned gate endcap (SAGE) architecture may include the enabling of higher layout density and, in particular, scaling of diffusion to diffusion spacing. However, certain application may not involve the use of SAGE, or regions of a structure may not include SAGE walls, yet high density may still be sought after. In such scenarios, undesirable merging of neighboring epitaxial regions may occur in high density locations. Balancing non-uniform epitaxial growth across integrated circuit structures can be challenging. Embodiments described herein may address unwanted merged epitaxial growth associated with growing source or drain structures on silicon (Si) regions having differential nanoribbon/nanowire architectures. Epitaxial regions may be embedded (e.g., portions of nanowires removed and then source or drain (S/D) growth is performed) or formed by vertical merging (e.g., epitaxial regions are formed around existing wires), as described in greater detail below in association with FIGS. 6A-6E.

In an exemplary process flow for structures started with merged epitaxial regions for neighboring devices of differing wire/ribbon widths, FIGS. 4A-4E illustrate cross-sectional views representing various operations in another method of fabricating neighboring gate-all-around integrated circuit structures having a conductive contact stressor between epitaxial source or drain regions, in accordance with an embodiment of the present disclosure.

Referring to FIG. 4A, a method of fabricating an integrated circuit structure 400 includes forming a first vertical arrangement of nanowires 406 and a second vertical arrangement of nanowires 404 above a substrate 402. The nanowires of the second vertical arrangement of nanowires 404 have a horizontal width greater than a horizontal width of the nanowires of the first vertical arrangement of nanowires 406 (e.g., nanowires 406 may be referred to as nanowires, and nanowires 404 may be referred to as nanoribbons). First epitaxial source or drain structures 412 are formed at ends of the first vertical arrangement of nanowires 406 (only one end depicted in FIG. 4A). Second epitaxial source or drain structures 410 are formed at ends of the second vertical arrangement of nanowires 404 (only one end depicted in FIG. 4A). Ones of the second epitaxial source or drain structures 410 and corresponding ones of the first epitaxial source or drain structures 412 have a merged region 413 there between.

Referring again to FIG. 4A, a hardmask 414, such as a carbon hardmask is formed over the second epitaxial source or drain structures 410 and the first epitaxial source or drain structures 412, and the merged region 413 there between. Referring to FIG. 4B, hardmask 414 is used as a foundation together with a stack 420 to form a trilayer mask composed of a topographic masking portion (hardmask 414), an anti-reflective coating (ARC) layer 422, and a photoresist layer 424 patterned to have an opening 426 therein. In a particular such embodiment, the anti-reflective coating layer 422 is a silicon ARC layer.

Referring to FIG. 4C, the pattern of the opening 426 is extended through the underlying structure to form patterned hardmask 414' and to disjoin the ones of the second epitaxial source or drain structures 410 and the corresponding merged ones of the first epitaxial source or drain structures 412. In an embodiment, the merged region 413 is removed to disjoin the ones of the second epitaxial source or drain structures 410 and the corresponding ones of the first epitaxial source or drain structures 412, forming disjoined second epitaxial source or drain structures 410' and first epitaxial source or drain structures 412'. In one embodiment, the merged region 413 is removed to disjoin the ones of the second epitaxial source or drain structures 410 and the corresponding ones of the first epitaxial source or drain structures 412 by anisotropically etching the merged region 413. The patterned photoresist layer 424 may then be removed.

Figure 4E:
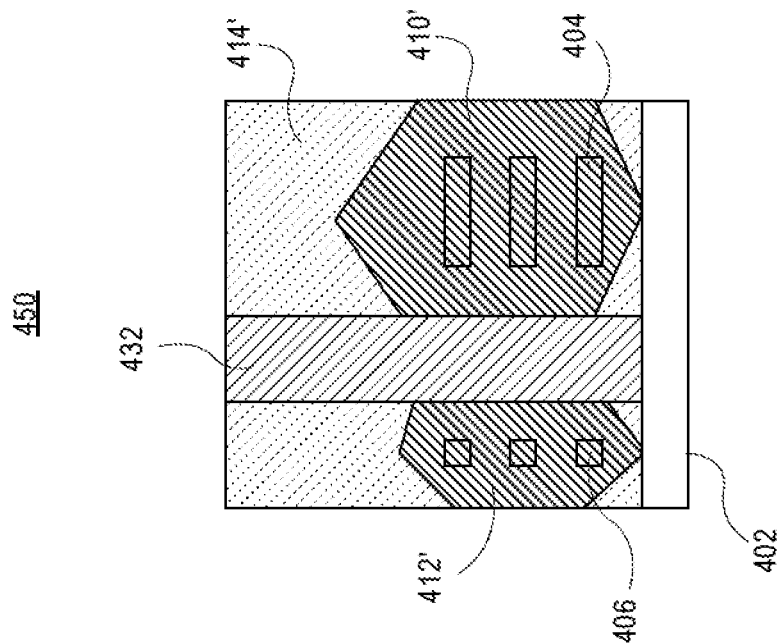
Figure 4D:
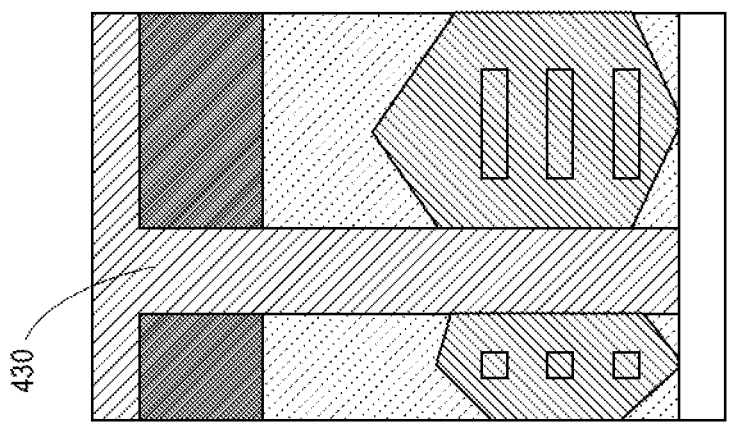

Referring to FIG. 4D, a conductive contact 430 is formed over the structure of FIG. 4C. Referring to FIG. 4E, the conductive contact 430 is planarized (which may involve removal of layer 422) to form an intervening conductive contact structure 432 between the ones of the disjoined second epitaxial source or drain structures 410' and the corresponding ones of the first epitaxial source or drain structures 412'. In one embodiment, the intervening conductive contact structure 432 provides a stress to the disjoined second epitaxial source or drain structures 410' and the corresponding ones of the first epitaxial source or drain structures 412'. The patterned hardmask 414' may subsequently be removed, as is depicted.

Referring again to FIG. 4E, in accordance with an embodiment of the present disclosure, an integrated circuit structure 450 includes a first vertical arrangement of nanowires 406 and a second vertical arrangement of nanowires 404 above a substrate 402. The nanowires of the second vertical arrangement of nanowires 404 have a horizontal width greater than a horizontal width of the nanowires of the first vertical arrangement of nanowires 406. First epitaxial source or drain structures 412' are at ends of the first vertical arrangement of nanowires 406. Second epitaxial source or drain structures 410' are at ends of the second vertical arrangement of nanowires 404. An intervening conductive contact structure 432 is between neighboring ones of the first epitaxial source or drain structures 412' and of the second epitaxial source or drain structures 410'.

In an embodiment, the intervening conductive contact structure 432 imparts a stress to the neighboring ones of the first epitaxial source or drain structures 412' and of the second epitaxial source or drain structures 410'. In one such embodiment, the intervening conductive contact structure 432 imparts a tensile stress to the neighboring ones of the first epitaxial source or drain structures 412' and of the second epitaxial source or drain structures 410'. In a specific such embodiment, the intervening conductive contact structure 432 includes tungsten. In another embodiment, the intervening conductive contact 432 structure imparts a compressive stress to the neighboring ones of the first epitaxial source or drain structures 412' and of the second epitaxial source or drain structures 410'.

In an embodiment, the first and second epitaxial source or drain structures are vertically non-discrete first and second epitaxial source or drain structures, as depicted in FIG. 4E, and as described in greater detail below. In another embodiment, the first and second epitaxial source or drain structures are vertically discrete first and second epitaxial source or drain structures, as is also described in greater detail below.

Although not depicted in the view of FIG. 4E, but as exemplified in other embodiments described herein, a first gate stack is over the first vertical arrangement of nanowires, and a second gate stack is over the second vertical arrangement of nanowires. In a particular embodiment, a first gate structure is over a first nanowire or nanowire stack and a corresponding first fin along a first direction. The first gate structure has a longest dimension along a second direction, the second direction orthogonal to the first direction. A second gate structure is over a second nanowire or nanowire stack and over a corresponding second fin. The second gate structure has a longest dimension along the second direction. In one embodiment, the second gate structure is continuous with the first gate structure along the second direction, e.g., a SAGE wall does not separate the first and second gate structures.

It is to be appreciated that nanowires or nanoribbons described herein may be silicon nanowires or silicon nanoribbons. As used throughout, a silicon layer may be used to describe a silicon material composed of a very substantial amount of, if not all, silicon. However, it is to be appreciated that, practically, 100% pure Si may be difficult to form and, hence, could include a tiny percentage of carbon, germanium or tin. Such impurities may be included as an unavoidable impurity or component during deposition of Si or may "contaminate" the Si upon diffusion during post deposition processing. As such, embodiments described herein directed to a silicon layer may include a silicon layer that contains a relatively small amount, e.g., "impurity" level, non-Si atoms or species, such as Ge, C or Sn. It is to be appreciated that a silicon layer as described herein may be undoped or may be doped with dopant atoms such as boron, phosphorous or arsenic.

It is to be appreciated that nanowires or nanoribbons described herein may be germanium nanowires or germanium nanoribbons. As used throughout, a germanium layer may be used to describe a germanium material composed of a very substantial amount of, if not all, germanium. However, it is to be appreciated that, practically, 100% pure Ge may be difficult to form and, hence, could include a tiny percentage of silicon, carbon or tin. Such impurities may be included as an unavoidable impurity or component during deposition of Ge or may "contaminate" the Ge upon diffusion during post deposition processing. As such, embodiments described herein directed to a germanium layer may include a germanium layer that contains a relatively small amount, e.g., "impurity" level, non-Ge atoms or species, such as carbon, silicon or tin. It is to be appreciated that a germanium layer as described herein may be undoped or may be doped with dopant atoms such as boron, phosphorous or arsenic.

It is to be appreciated that nanowires or nanoribbons described herein may be silicon germanium nanowires or silicon germanium nanoribbons. As used throughout, a silicon germanium layer may be used to describe a silicon germanium material composed of substantial portions of both silicon and germanium, such as at least 5% of both. In some embodiments, the amount of germanium is greater than the amount of silicon. In particular embodiments, a silicon germanium layer includes approximately 60% germanium and approximately 40% silicon ($Si_{40}Ge_{60}$). In other embodiments, the amount of silicon is greater than the amount of germanium. In particular embodiments, a silicon germanium layer includes approximately 30% germanium and approximately 70% silicon ($Si_{70}Ge_{30}$). It is to be appreciated that, practically, 100% pure silicon germanium (referred to generally as SiGe) may be difficult to form and, hence, could include a tiny percentage of carbon or tin. Such impurities may be included as an unavoidable impurity or component during deposition of SiGe or may "contaminate" the SiGe upon diffusion during post deposition processing. As such, embodiments described herein directed to a silicon germanium layer may include a silicon germanium layer that contains a relatively small amount, e.g., "impurity" level, non-Ge and non-Si atoms or species, such as carbon or tin. It is to be appreciated that a silicon germanium layer as described herein may be undoped or may be doped with dopant atoms such as boron, phosphorous or arsenic.

To highlight an exemplary integrated circuit structure having three vertically arranged nanowires, FIG. 5A illustrates a three-dimensional cross-sectional view of a nanowire-based integrated circuit structure, in accordance with an embodiment of the present disclosure. FIG. 5B illustrates a cross-sectional source or drain view of the nanowire-based integrated circuit structure of FIG. 5A, as taken along the a-a' axis. FIG. 5C illustrates a cross-sectional channel view of the nanowire-based integrated circuit structure of FIG. 5A, as taken along the b-b' axis.

Referring to FIG. 5A, an integrated circuit structure 500 includes one or more vertically stacked nanowires (504 set) above a substrate 502. An optional fin between the bottommost nanowire and the substrate 502 is not depicted for the sake of emphasizing the nanowire portion for illustrative purposes. Embodiments herein are targeted at both single wire devices and multiple wire devices. As an example, a three nanowire-based devices having nanowires 504A, 504B and 504C is shown for illustrative purposes. For convenience of description, nanowire 504A is used as an example where description is focused on one of the nanowires. It is to be appreciated that where attributes of one nanowire are described, embodiments based on a plurality of nanowires may have the same or essentially the same attributes for each of the nanowires. Alternatively, in other embodiments, a single fin is used in place of a nanowire/ribbon or stack of nanowires/ribbons.

Each of the nanowires 504 includes a channel region 506 in the nanowire. The channel region 506 has a length (L). Referring to FIG. 5C, the channel region also has a perimeter (Pc) orthogonal to the length (L). Referring to both FIGS. 5A and 5C, a gate electrode stack 508 surrounds the entire perimeter (Pc) of each of the channel regions 506. The gate electrode stack 508 includes a gate electrode along with a gate dielectric layer between the channel region 506 and the gate electrode (not shown). In an embodiment, the channel region is discrete in that it is completely surrounded by the gate electrode stack 508 without any intervening material such as underlying substrate material or overlying channel fabrication materials. Accordingly, in embodiments having a plurality of nanowires 504, the channel regions 506 of the nanowires are also discrete relative to one another.

Referring to both FIGS. 5A and 5B, integrated circuit structure 500 includes a pair of non-discrete source or drain regions 510/512. The pair of non-discrete source or drain regions 510/512 is on either side of the channel regions 506 of the plurality of vertically stacked nanowires 504. Furthermore, the pair of non-discrete source or drain regions 510/512 is adjoining for the channel regions 506 of the plurality of vertically stacked nanowires 504. In one such embodiment, not depicted, the pair of non-discrete source or drain regions 510/512 is directly vertically adjoining for the channel regions 506 in that epitaxial growth is on and between nanowire portions extending beyond the channel regions 506 (as exemplified in FIGS. 3C and 4E), where nanowire ends are shown within the source or drain structures. In another embodiment, as depicted in FIG. 5A, the pair of non-discrete source or drain regions 510/512 is indirectly vertically adjoining for the channel regions 506 in that they are formed at the ends of the nanowires and not between the nanowires.

In an embodiment, as depicted, the source or drain regions 510/512 are non-discrete in that there are not individual and discrete source or drain regions for each channel region 506 of a nanowire 504. Accordingly, in embodiments having a plurality of nanowires 504, the source or drain regions 510/512 of the nanowires are global or unified source or drain regions as opposed to discrete for each nanowire. In one embodiment, from a cross-sectional perspective orthogonal to the length of the discrete channel regions 506, each of the pair of non-discrete source or drain regions 510/512 is approximately rectangular in shape with a bottom tapered portion and a top vertex portion, as depicted in FIG. 5B. In other embodiments, however, the source or drain regions 510/512 of the nanowires are relatively larger yet discrete non-vertically merged epitaxial structures.

In accordance with an embodiment of the present disclosure, and as depicted in FIGS. 5A and 5B, integrated circuit structure 500 further includes a pair of contacts 514, each contact 514 on one of the pair of non-discrete source or drain regions 510/512. In one such embodiment, in a vertical sense, each contact 514 completely surrounds the respective non-discrete source or drain region 510/512. In another aspect, the entire perimeter of the non-discrete source or drain regions 510/512 may not be accessible for contact with contacts 514, and the contact 514 thus only partially surrounds the non-discrete source or drain regions 510/512, as depicted in FIG. 5B. In a contrasting embodiment, not depicted, the entire perimeter of the non-discrete source or drain regions 510/512, as taken along the a-a' axis, is surrounded by the contacts 514.

Referring to FIGS. 5B and 5C, the non-discrete source or drain regions 510/512 are global in the sense that a single unified feature is used as a source or drain region for a plurality (in this case, 3) of nanowires 504 and, more particularly, for more than one discrete channel region 506. In an embodiment, the pair of non-discrete source or drain regions 510/512 is composed of a semiconductor material different than the semiconductor material of the discrete channel regions 506, e.g., the pair of non-discrete source or drain regions 510/512 is composed of a silicon germanium while the discrete channel regions 506 are composed of silicon. In another embodiment, the pair of non-discrete source or drain regions 510/512 is composed of a semiconductor material the same or essentially the same as the semiconductor material of the discrete channel regions 506, e.g., both the pair of non-discrete source or drain regions 510/512 and the discrete channel regions 506 are composed of silicon.

Referring again to FIG. 5A, in an embodiment, integrated circuit structure 500 further includes a pair of spacers 516. As is depicted, outer portions of the pair of spacers 516 may overlap portions of the non-discrete source or drain regions 510/512, providing for "embedded" portions of the non-discrete source or drain regions 510/512 beneath the pair of spacers 516. As is also depicted, the embedded portions of the non-discrete source or drain regions 510/512 may not extend beneath the entirety of the pair of spacers 516.

Substrate 502 may be composed of a material suitable for integrated circuit structure fabrication. In one embodiment, substrate 502 includes a lower bulk substrate composed of a single crystal of a material which may include, but is not limited to, silicon, germanium, silicon-germanium or a group III-V compound semiconductor material. An upper insulator layer composed of a material which may include, but is not limited to, silicon dioxide, silicon nitride or silicon oxy-nitride is on the lower bulk substrate. Thus, the structure 500 may be fabricated from a starting semiconductor-on-insulator substrate. Alternatively, the structure 500 is formed directly from a bulk substrate and local oxidation is used to form electrically insulative portions in place of the above described upper insulator layer. In another alternative embodiment, the structure 500 is formed directly from a bulk substrate and doping is used to form electrically isolated active regions, such as nanowires, thereon. In one such embodiment, the first nanowire (i.e., proximate the substrate) is in the form of an omega-FET type structure.

In an embodiment, the nanowires 504 may be sized as wires or ribbons, as described below, and may have squared-off or rounder corners. In an embodiment, the nanowires 504 are composed of a material such as, but not limited to, silicon, germanium, or a combination thereof. In one such embodiment, the nanowires are single-crystalline. For example, for a silicon nanowire 504, a single-crystalline nanowire may be based from a (100) global orientation, e.g., with a <100> plane in the z-direction. As described below, other orientations may also be considered. In an embodiment, the dimensions of the nanowires 504, from a cross-sectional perspective, are on the nano-scale. For example, in a specific embodiment, the smallest dimension of the nanowires 504 is less than approximately 20 nanometers. In an embodiment, the nanowires 504 are composed of a strained material, particularly in the channel regions 506.

Referring to FIGS. 5C, in an embodiment, each of the channel regions 506 has a width (Wc) and a height (Hc), the width (Wc) approximately the same as the height (Hc). That is, in both cases, the channel regions 506 are square-like or, if corner-rounded, circle-like in cross-section profile. In another aspect, the width and height of the channel region need not be the same, such as the case for nanoribbbons as described throughout.

In another aspect, methods of fabricating a nanowire portion of a fin/nanowire integrated circuit structure are provided. For example, FIGS. 6A-6E illustrate three-dimensional cross-sectional views representing various operations in a method of fabricating a nanowire portion of a fin/nanowire structure, in accordance with an embodiment of the present disclosure. It is to be appreciated that, for clarity, a laterally neighboring integrated circuit structure and an intervening conductive contact stressor implemented between disjoined neighboring source or drain regions are not depicted in association with FIGS. 6A-6E.

Figure 6A:
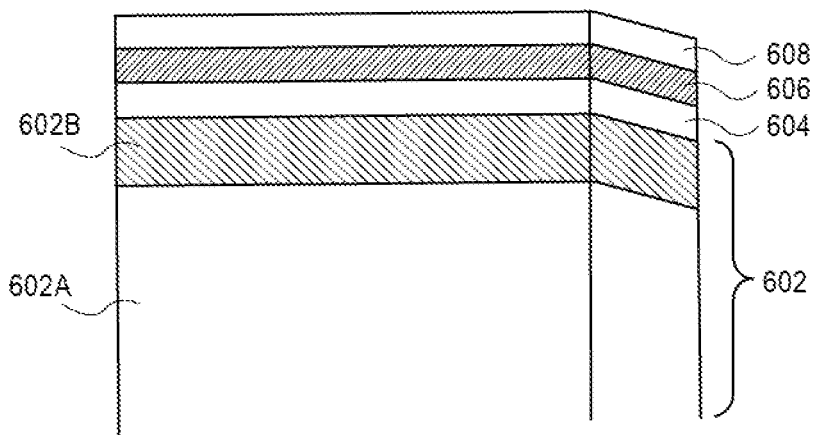
FIGS. 6A-6E illustrate three-dimensional cross-sectional views representing various operations in a method of fabricating a nanowire portion of a fin/nanowire structure, in accordance with an embodiment of the present disclosure.

A method of fabricating a nanowire integrated circuit structure may include forming a nanowire above a substrate. In a specific example showing the formation of two silicon nanowires, FIG. 6A illustrates a substrate 602 (e.g., composed of a bulk substrate silicon substrate 602A with an insulating silicon dioxide layer 602B there on) having a silicon layer 604/silicon germanium layer 606/silicon layer 608 stack thereon. It is to be understood that, in another embodiment, a silicon germanium layer/silicon layer/silicon germanium layer stack may be used to ultimately form two silicon germanium nanowires.

Figure 6B:
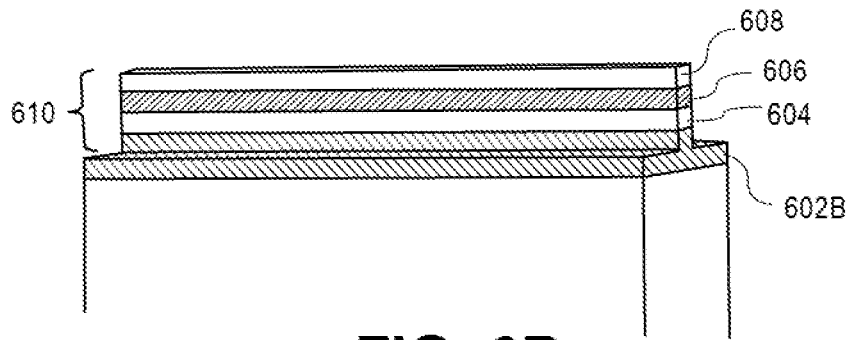

Referring to FIG. 6B, a portion of the silicon layer 604/silicon germanium layer 606/silicon layer 608 stack as well as a top portion of the silicon dioxide layer 602B is patterned into a fin-type structure 610, e.g., with a mask and plasma etch process. It is to be appreciated that, for illustrative purposes, the etch for FIG. 6B is shown as forming two silicon nanowire precursor portions. Although the etch is shown for ease of illustration as ending within a bottom isolation layer, more complex stacks are contemplated within the context of embodiments of the present disclosure. For example, the process may be applied to a nanowire/fin stack as described in association with FIG. 5.

Figure 6C:
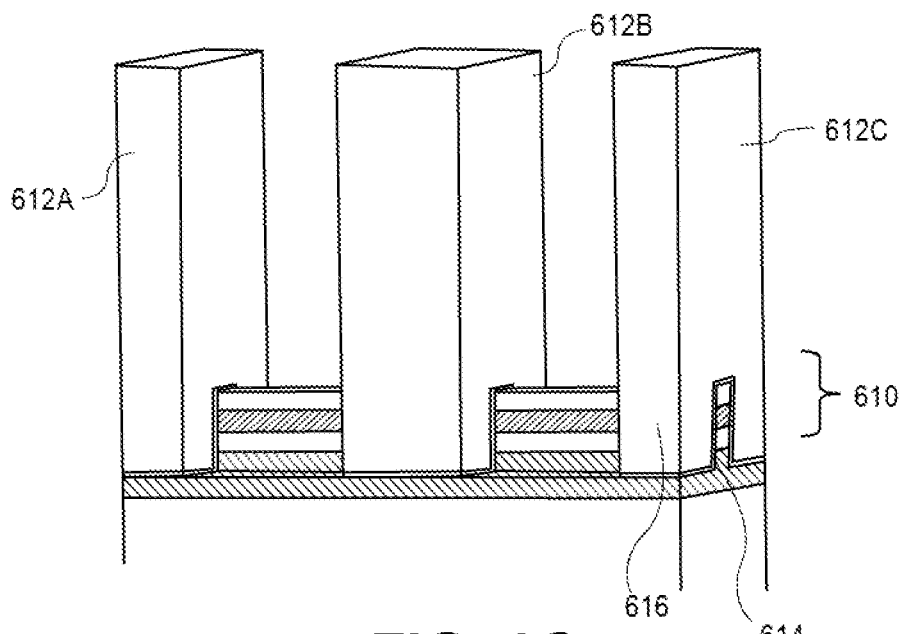

The method may also include forming a channel region in the nanowire, the channel region having a length and a perimeter orthogonal to the length. In a specific example showing the formation of three gate structures over the two silicon nanowires, FIG. 6C illustrates the fin-type structure 610 with three sacrificial gates 612A, 612B, and 612C thereon. In one such embodiment, the three sacrificial gates 612A, 612B, and 612C are composed of a sacrificial gate oxide layer 614 and a sacrificial polysilicon gate layer 616 which are blanket deposited and patterned with a plasma etch process.

Figure 6D:
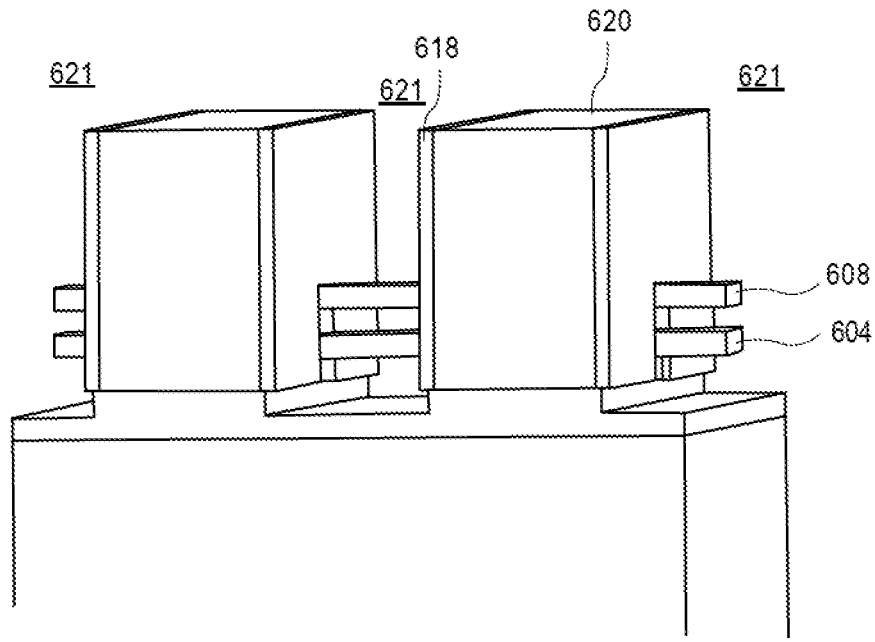

Following patterning to form the three sacrificial gates 612A, 612B, and 612C, spacers may be formed on the sidewalls of the three sacrificial gates 612A, 612B, and 612C, doping may be performed (e.g., tip and/or source and drain type doping), and an interlayer dielectric layer may be formed to cover the three sacrificial gates 612A, 612B, and 612C. The interlayer dielectric layer may be polished to expose the three sacrificial gates 612A, 612B, and 612C for a replacement gate, or gate-last, process. Referring to FIG. 6D, the three sacrificial gates 612A, 612B, and 612C have been removed, leaving spacers 618 and a portion of the interlayer dielectric layer 620 remaining.

Additionally, referring again to FIG. 6D the portions of the silicon germanium layer 606 and the portion of the insulating silicon dioxide layer 602B of the fin structure 610 are removed in the regions originally covered by the three sacrificial gates 612A, 612B, and 612C. Discrete portions of the silicon layers 604 and 608 thus remain, as depicted in FIG. 6D.

The discrete portions of the silicon layers 604 and 608 shown in FIG. 6D will, in one embodiment, ultimately become channel regions in a nanowire-based device. Thus, at the process stage depicted in FIG. 6D, channel engineering or tuning may be performed. For example, in one embodiment, the discrete portions of the silicon layers 604 and 608 shown in FIG. 6D are thinned using oxidation and etch processes. Such an etch process may be performed at the same time the wires are separated by etching the silicon germanium layer 606. Accordingly, the initial wires formed from silicon layers 604 and 608 begin thicker and are thinned to a size suitable for a channel region in a nanowire device, independent from the sizing of the source and drain regions of the device. Thus, in an embodiment, forming the channel region includes removing a portion of the nanowire, and the resulting perimeters of the source and drain regions (described below) are greater than the perimeter of the resulting channel region.

Figure 6E:
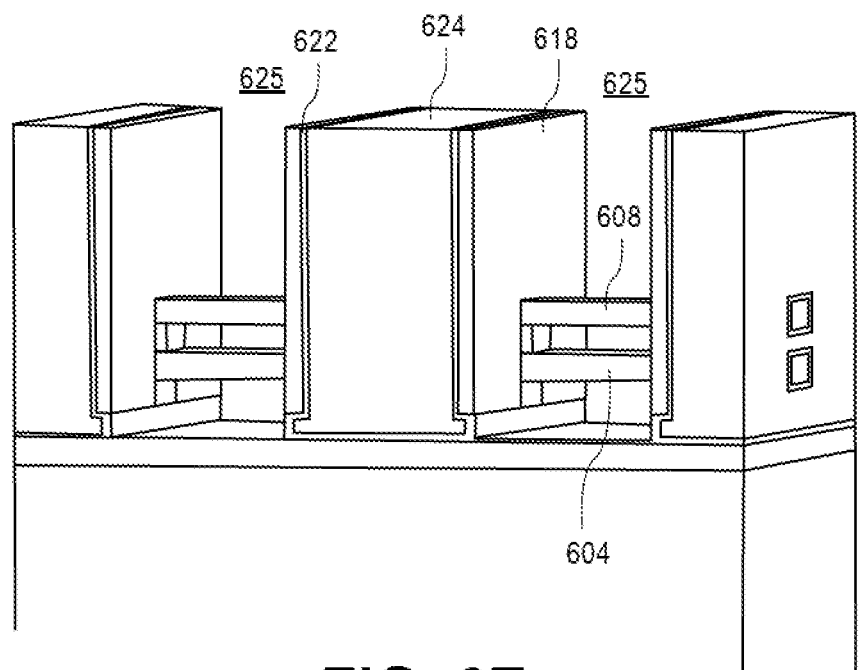

The method may also include forming a gate electrode stack surrounding the entire perimeter of the channel region. In the specific example showing the formation of three gate structures over the two silicon nanowires, FIG. 6E illustrates the structure following deposition of a gate dielectric layer 622 (such as a high-k gate dielectric layer) and a gate electrode layer 624 (such as a metal gate electrode layer), and subsequent polishing, in between the spacers 618. That is, gate structures are formed in the trenches 621 of FIG. 6D. Additionally, FIG. 6E depicts the result of the subsequent removal of the interlayer dielectric layer 620 after formation of the permanent gate stack. The portions of the silicon germanium layer 606 and the portion of the insulating silicon dioxide layer 602B of the fin structure 610 are also removed in the regions originally covered by the portion of the interlayer dielectric layer 620 depicted in FIG. 6D. Discrete portions of the silicon layers 604 and 608 thus remain, as depicted in FIG. 6E.

The method may also include forming a pair of source and drain regions in the nanowire, on either side of the channel region, each of the source and drain regions having a perimeter orthogonal to the length of the channel region. Specifically, the discrete portions of the silicon layers 604 and 608 shown in FIG. 6E will, in one embodiment, ultimately become at least a portion of the source and drain regions in a nanowire-based device. In one such embodiment, epitaxial source or drain structures are formed by merging epitaxial material around existing nanowires 604 and 608. In another embodiment, epitaxial source or drain structures are embedded, e.g., portions of nanowires 604 and 608 are removed and then source or drain (S/D) growth is performed. In either case, in accordance with an embodiment of the present disclosure, such epitaxial source or drain structures are disjoined from corresponding epitaxial source or drain structures from a neighboring device and an intervening conductive contact stressor is formed, as exemplified in association with FIGS. 4A-4E.

The method may subsequently include forming a pair of contacts, a first of the pair of contacts completely or nearly completely surrounding the perimeter of the source region, and a second of the pair of contacts completely or nearly completely surrounding the perimeter of the drain region. Specifically, contacts are formed in the trenches 625 of FIG. 6E following epitaxial growth and recess. In an embodiment, the contacts are formed from a metallic species. In one such embodiment, the metallic species is formed by conformally depositing a conductive material and then filling any remaining trench volume. The conformal aspect of the deposition may be performed by using chemical vapor deposition (CVD), atomic layer deposition (ALD), or metal reflow.

In an embodiment, as described throughout, an integrated circuit structure includes non-planar devices such as, but not limited to, a finFET or a tri-gate device with corresponding one or more overlying nanowire structures. In such an embodiment, a corresponding semiconducting channel region is composed of or is formed in a three-dimensional body with one or more discrete nanowire channel portions overlying the three-dimensional body. In one such embodiment, the gate structures surround at least a top surface and a pair of sidewalls of the three-dimensional body, and further surrounds each of the one or more discrete nanowire channel portions.

In an embodiment, as described throughout, a substrate may be composed of a semiconductor material that can withstand a manufacturing process and in which charge can migrate. In an embodiment, the substrate is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a group III-V material and the charge-carrier dopant impurity atoms are ones such as, but not limited to, carbon, silicon, germanium, oxygen, sulfur, selenium or tellurium.

In an embodiment, as described throughout, a trench isolation layer may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, a trench isolation layer is composed of a dielectric material such as, but not limited to, silicon dioxide, silicon oxy-nitride, silicon nitride, or carbon-doped silicon nitride.

In an embodiment, as described throughout, self-aligned gate endcap isolation structures may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

In an embodiment, as described throughout, gate structures may be composed of a gate electrode stack which includes a gate dielectric layer and a gate electrode layer. In an embodiment, the gate electrode of the gate electrode stack is composed of a metal gate and the gate dielectric layer includes a high-k material.

In an embodiment, the gate dielectric of region is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a corresponding substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In an embodiment, the top high-k portion consists of a "U"-shaped structure that includes a bottom portion substantially parallel to the surface of the substrate and two sidewall portions that are substantially perpendicular to the top surface of the substrate. In an embodiment, a gate dielectric of region includes a layer of non-native silicon oxide in addition to a layer of high-k material. The layer of non-native silicon oxide may be formed using a CVD process and may be formed below or above the layer of high-k material. In an exemplary embodiment, a layer of non-native silicon oxide is formed beneath a layer of high-k material.

In an embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, as described throughout, local interconnects, gate contacts, overlying gate contact vias, and overlying metal interconnects may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). A common example is the use of copper structures that may or may not include barrier layers (such as Ta or TaN layers) between the copper and surrounding ILD material. As used herein, the term metal includes alloys, stacks, and other combinations of multiple metals. For example, the metal interconnect lines may include barrier layers, stacks of different metals or alloys, etc.

In an embodiment (although not shown), a contact pattern which is essentially perfectly aligned to an existing gate pattern is formed while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, gate structures described herein may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to fabricate an integrated circuit structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In an embodiment, an integrated circuit structure has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for integrated circuit structure or semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
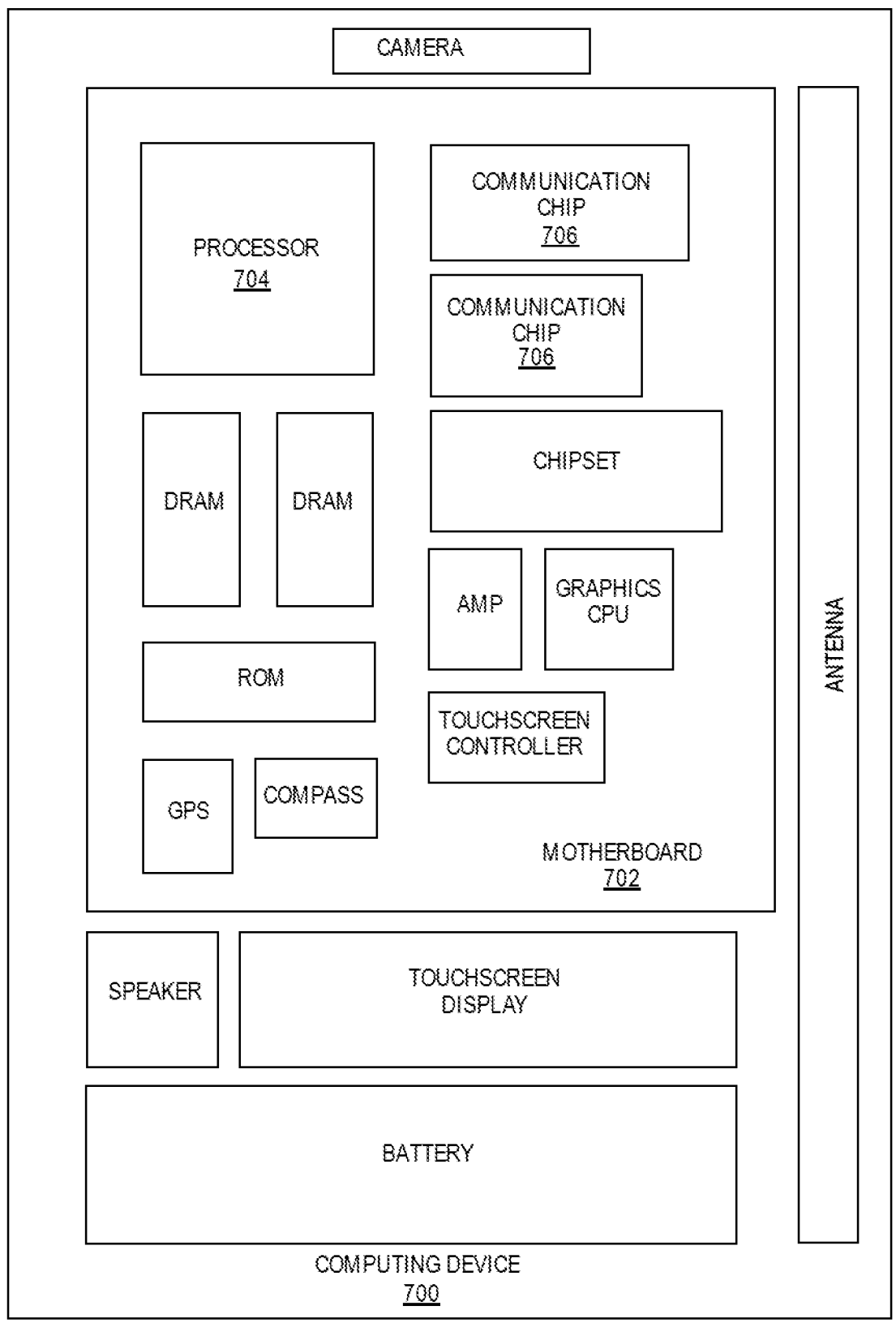
FIG. 7 illustrates a computing device in accordance with one implementation of an embodiment of the disclosure.

FIG. 7 illustrates a computing device 700 in accordance with one implementation of an embodiment of the present disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. The integrated circuit die of the processor 704 may include one or more structures, such as integrated circuit structures built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. The integrated circuit die of the communication chip 706 may include one or more structures, such as integrated circuit structures built in accordance with implementations of embodiments of the present disclosure.

In further implementations, another component housed within the computing device 700 may contain an integrated circuit die that includes one or structures, such as integrated circuit structures built in accordance with implementations of embodiments of the present disclosure.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
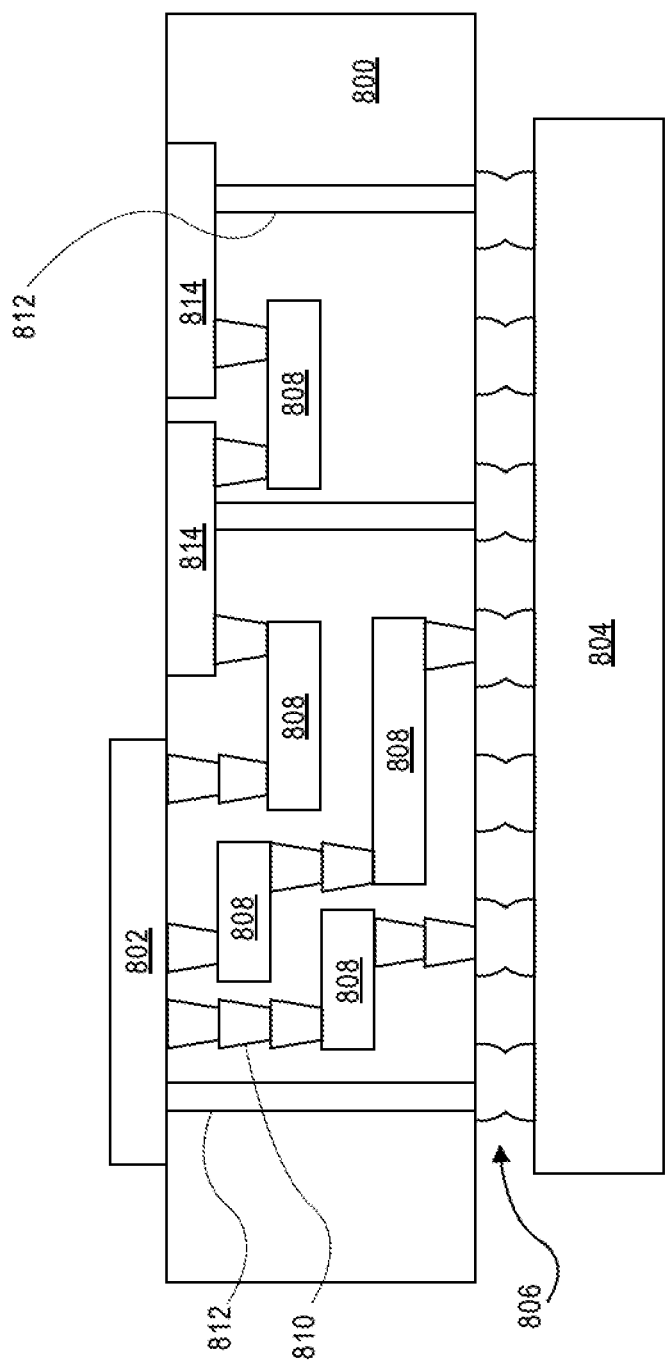
FIG. 8 illustrates an interposer that includes one or more embodiments of the disclosure.

FIG. 8 illustrates an interposer 800 that includes one or more embodiments of the present disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer 800 may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the disclosure, apparatuses or processes disclosed herein may be used in the fabrication of interposer 800 or in the fabrication of components included in the interposer 800.

Thus, embodiments of the present disclosure include neighboring gate-all-around integrated circuit structures having a conductive contact stressor between epitaxial source or drain regions, and methods of fabricating neighboring gate-all-around integrated circuit structures having a conductive contact stressor between epitaxial source or drain regions.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a first vertical arrangement of nanowires and a second vertical arrangement of nanowires above a substrate. A first gate stack is over the first vertical arrangement of nanowires. A second gate stack is over the second vertical arrangement of nanowires. First epitaxial source or drain structures are at ends of the first vertical arrangement of nanowires. Second epitaxial source or drain structures are at ends of the second vertical arrangement of nanowires. An intervening conductive contact structure is between neighboring ones of the first epitaxial source or drain structures and of the second epitaxial source or drain structures. The intervening conductive contact structure imparts a stress to the neighboring ones of the first epitaxial source or drain structures and of the second epitaxial source or drain structures.

Example embodiment 2: The integrated circuit structure of example embodiment 1, wherein the intervening conductive contact structure imparts a tensile stress to the neighboring ones of the first epitaxial source or drain structures and of the second epitaxial source or drain structures.

Example embodiment 3: The integrated circuit structure of example embodiment 2, wherein the intervening conductive contact structure includes tungsten.

Example embodiment 4: The integrated circuit structure of example embodiment 1, wherein the intervening conductive contact structure imparts a compressive stress to the neighboring ones of the first epitaxial source or drain structures and of the second epitaxial source or drain structures.

Example embodiment 5: The integrated circuit structure of example embodiment 1, 2, 3 or 4, wherein the first gate stack has dielectric sidewall spacers, and the first epitaxial source or drain structures are first embedded epitaxial source or drain structures extending beneath the dielectric sidewalls spacers of the first gate stack, and wherein the second gate stack has dielectric sidewall spacers, and the second epitaxial source or drain structures are second embedded epitaxial source or drain structures extending beneath the dielectric sidewalls spacers of the second gate stack.

Example embodiment 6: The integrated circuit structure of example embodiment 1, 2, 3, 4 or 5, wherein the first and second epitaxial source or drain structures are non-discrete first and second epitaxial source or drain structures.

Example embodiment 7: The integrated circuit structure of example embodiment 1, 2, 3, 4, 5 or 6, wherein the first and second gate stacks each include a high-k gate dielectric layer and a metal gate electrode.

Example embodiment 8: An integrated circuit structure includes a first vertical arrangement of nanowires and a second vertical arrangement of nanowires above a substrate. The nanowires of the second vertical arrangement of nanowires have a horizontal width greater than a horizontal width of the nanowires of the first vertical arrangement of nanowires. A first gate stack is over the first vertical arrangement of nanowires. A second gate stack is over the second vertical arrangement of nanowires. First epitaxial source or drain structures are at ends of the first vertical arrangement of nanowires. Second epitaxial source or drain structures are at ends of the second vertical arrangement of nanowires. An intervening conductive contact structure is between neighboring ones of the first epitaxial source or drain structures and of the second epitaxial source or drain structures.

Example embodiment 9: The integrated circuit structure of example embodiment 8, wherein the intervening conductive contact structure imparts a stress to the neighboring ones of the first epitaxial source or drain structures and of the second epitaxial source or drain structures.

Example embodiment 10: The integrated circuit structure of example embodiment 9, wherein the intervening conductive contact structure imparts a tensile stress to the neighboring ones of the first epitaxial source or drain structures and of the second epitaxial source or drain structures.

Example embodiment 11: The integrated circuit structure of example embodiment 10, wherein the intervening conductive contact structure includes tungsten.

Example embodiment 12: The integrated circuit structure of example embodiment 9, wherein the intervening conductive contact structure imparts a compressive stress to the neighboring ones of the first epitaxial source or drain structures and of the second epitaxial source or drain structures.

Example embodiment 13: The integrated circuit structure of example embodiment 8, 9, 10, 11 or 12, wherein the first gate stack has dielectric sidewall spacers, and the first epitaxial source or drain structures are first embedded epitaxial source or drain structures extending beneath the dielectric sidewalls spacers of the first gate stack, and wherein the second gate stack has dielectric sidewall spacers, and the second epitaxial source or drain structures are second embedded epitaxial source or drain structures extending beneath the dielectric sidewalls spacers of the second gate stack.

Example embodiment 14: The integrated circuit structure of example embodiment 8, 9, 10, 11, 12 or 13, wherein the first and second epitaxial source or drain structures are non-discrete first and second epitaxial source or drain structures.

Example embodiment 15: The integrated circuit structure of example embodiment 8, 9, 10, 11, 12, 13 or 14, wherein the first and second gate stacks each include a high-k gate dielectric layer and a metal gate electrode.

Example embodiment 16: A computing device includes a board, and a component coupled to the board. The component includes an integrated circuit structure including a first vertical arrangement of nanowires and a second vertical arrangement of nanowires above a substrate. A first gate stack is over the first vertical arrangement of nanowires. A second gate stack is over the second vertical arrangement of nanowires. First epitaxial source or drain structures are at ends of the first vertical arrangement of nanowires. Second epitaxial source or drain structures are at ends of the second vertical arrangement of nanowires. An intervening conductive contact structure is between neighboring ones of the first epitaxial source or drain structures and of the second epitaxial source or drain structures. The intervening conductive contact structure imparts a stress to the neighboring ones of the first epitaxial source or drain structures and of the second epitaxial source or drain structures.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, further including a camera coupled to the board.

Example embodiment 20: The computing device of example embodiment 16, 17, 18 or 19, wherein the component is a packaged integrated circuit die.

What is claimed is:

1. An integrated circuit structure, comprising:
a first vertical arrangement of nanowires and a second vertical arrangement of nanowires above a substrate;
a first gate stack over the first vertical arrangement of nanowires;
a second gate stack over the second vertical arrangement of nanowires;
first epitaxial source or drain structures at ends of the first vertical arrangement of nanowires;
second epitaxial source or drain structures at ends of the second vertical arrangement of nanowires; and
an intervening conductive contact structure between and in contact with neighboring ones of the first epitaxial source or drain structures and of the second epitaxial source or drain structures, wherein the neighboring ones of the first epitaxial source or drain structures and the second epitaxial source or drain structures are discontinuous from one another.

2. The integrated circuit structure of claim 1, wherein the intervening conductive contact structure imparts a tensile stress to the neighboring ones of the first epitaxial source or drain structures and of the second epitaxial source or drain structures.

3. The integrated circuit structure of claim 2, wherein the intervening conductive contact structure comprises tungsten.

4. The integrated circuit structure of claim 1, wherein the intervening conductive contact structure imparts a compressive stress to the neighboring ones of the first epitaxial source or drain structures and of the second epitaxial source or drain structures.

5. The integrated circuit structure of claim 1, wherein the first gate stack has dielectric sidewall spacers, and the first epitaxial source or drain structures are first embedded epitaxial source or drain structures extending beneath the dielectric sidewalls spacers of the first gate stack, and wherein the second gate stack has dielectric sidewall spacers, and the second epitaxial source or drain structures are second embedded epitaxial source or drain structures extending beneath the dielectric sidewalls spacers of the second gate stack.

6. The integrated circuit structure of claim 1, wherein the first and second epitaxial source or drain structures are non-discrete first and second epitaxial source or drain structures.

7. The integrated circuit structure of claim 1, wherein the first and second gate stacks each comprise a high-k gate dielectric layer and a metal gate electrode.

8. An integrated circuit structure, comprising:
a first vertical arrangement of nanowires and a second vertical arrangement of nanowires above a substrate, the nanowires of the second vertical arrangement of nanowires having a horizontal width greater than a horizontal width of the nanowires of the first vertical arrangement of nanowires;
a first gate stack over the first vertical arrangement of nanowires;
a second gate stack over the second vertical arrangement of nanowires;
first epitaxial source or drain structures at ends of the first vertical arrangement of nanowires;
second epitaxial source or drain structures at ends of the second vertical arrangement of nanowires; and
an intervening conductive contact structure between and in contact with neighboring ones of the first epitaxial source or drain structures and of the second epitaxial source or drain structures, wherein the neighboring ones of the first epitaxial source or drain structures and the second epitaxial source or drain structures are discontinuous from one another.

9. The integrated circuit structure of claim 8, wherein the intervening conductive contact structure imparts a stress to the neighboring ones of the first epitaxial source or drain structures and of the second epitaxial source or drain structures.

10. The integrated circuit structure of claim 9, wherein the intervening conductive contact structure imparts a tensile stress to the neighboring ones of the first epitaxial source or drain structures and of the second epitaxial source or drain structures.

11. The integrated circuit structure of claim 10, wherein the intervening conductive contact structure comprises tungsten.

12. The integrated circuit structure of claim 9, wherein the intervening conductive contact structure imparts a compressive stress to the neighboring ones of the first epitaxial source or drain structures and of the second epitaxial source or drain structures.

13. The integrated circuit structure of claim 8, wherein the first gate stack has dielectric sidewall spacers, and the first epitaxial source or drain structures are first embedded epitaxial source or drain structures extending beneath the dielectric sidewalls spacers of the first gate stack, and wherein the second gate stack has dielectric sidewall spacers, and the second epitaxial source or drain structures are second embedded epitaxial source or drain structures extending beneath the dielectric sidewalls spacers of the second gate stack.

14. The integrated circuit structure of claim 8, wherein the first and second epitaxial source or drain structures are non-discrete first and second epitaxial source or drain structures.

15. The integrated circuit structure of claim 8, wherein the first and second gate stacks each comprise a high-k gate dielectric layer and a metal gate electrode.

16. A computing device, comprising:
a board; and
a component coupled to the board, the component including an integrated circuit structure, comprising:
a first vertical arrangement of nanowires and a second vertical arrangement of nanowires above a substrate;
a first gate stack over the first vertical arrangement of nanowires;
a second gate stack over the second vertical arrangement of nanowires;

first epitaxial source or drain structures at ends of the first vertical arrangement of nanowires;

second epitaxial source or drain structures at ends of the second vertical arrangement of nanowires; and an intervening conductive contact structure between and in contact with neighboring ones of the first epitaxial source or drain structures and of the second epitaxial source or drain structures, wherein the neighboring ones of the first epitaxial source or drain structures and the second epitaxial source or drain structures are discontinuous from one another.

17. The computing device of claim 16, further comprising:

a memory coupled to the board.

18. The computing device of claim 16, further comprising:

a communication chip coupled to the board.

19. The computing device of claim 16, further comprising:

a camera coupled to the board.

20. The computing device of claim 16, wherein the component is a packaged integrated circuit die.

* * * * *